(12) United States Patent
Kim et al.

(10) Patent No.: US 9,728,424 B2
(45) Date of Patent: Aug. 8, 2017

(54) METHOD OF FABRICATING A PACKAGED INTEGRATED CIRCUIT WITH THROUGH-SILICON VIA AN INNER SUBSTRATE

(71) Applicant: Samsung Electronics Co., Ltd., Suwon-si (KR)

(72) Inventors: Ji-hwang Kim, Cheonan-si (KR); Un-byoung Kang, Hwaseong-si (KR); Cha-jea Jo, Incheon (KR); Tae-je Cho, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/723,642

(22) Filed: May 28, 2015

(65) Prior Publication Data

US 2016/0013091 A1    Jan. 14, 2016

(30) Foreign Application Priority Data

Jul. 8, 2014    (KR) ........................ 10-2014-0085364

(51) Int. Cl.

| | | |
|---|---|---|
| *H01L 21/00* | (2006.01) | |
| *H01L 23/48* | (2006.01) | |
| *B23K 31/02* | (2006.01) | |
| *H01L 21/48* | (2006.01) | |
| *H01L 21/56* | (2006.01) | |
| *H01L 23/498* | (2006.01) | |
| *H01L 23/00* | (2006.01) | |
| *H01L 23/14* | (2006.01) | |

(52) U.S. Cl.
CPC .......... *H01L 21/486* (2013.01); *H01L 21/563* (2013.01); *H01L 23/49827* (2013.01); *H01L 24/17* (2013.01); *H01L 24/81* (2013.01); *H01L 23/147* (2013.01); *H01L 23/49816* (2013.01); *H01L 24/32* (2013.01); *H01L 2224/16225* (2013.01); *H01L 2924/15311* (2013.01); *H01L 2924/181* (2013.01)

(58) Field of Classification Search
CPC ..... H01L 21/563; H01L 21/486; H01L 24/32; H01L 24/17; H01L 24/81; H01L 23/49827
See application file for complete search history.

(56) References Cited

U.S. PATENT DOCUMENTS

| | | | |
|---|---|---|---|
| 6,260,264 B1 * | 7/2001 | Chen | ..................... H01L 21/563 174/260 |
| 7,018,920 B2 | 3/2006 | Meagley et al. | |
| 7,435,664 B2 | 10/2008 | Lu et al. | |
| 7,816,180 B2 * | 10/2010 | Mizukoshi | ............ H01L 21/563 257/E21.511 |
| 7,927,977 B2 | 4/2011 | Makala et al. | |
| (Continued) | | | |

FOREIGN PATENT DOCUMENTS

KR    100840788    6/2008

*Primary Examiner* — Alonzo Chambliss
(74) *Attorney, Agent, or Firm* — Onello & Mello, LLP.

(57) ABSTRACT

A method of manufacturing a semiconductor package includes forming a bonding layer on a carrier substrate, bonding an inner substrate to the carrier substrate, removing the carrier substrate, and forming a gap-filling portion by removing a portion of the bonding layer to expose a portion of a solder ball provided in the inner substrate. The inner substrate may be mounted on a package substrate and a semiconductor chip may be mounted on the inner substrate.

20 Claims, 16 Drawing Sheets

(56) References Cited

U.S. PATENT DOCUMENTS

| | | | |
|---|---|---|---|
| 8,008,130 B2* | 8/2011 | Honda | H01L 21/486 438/122 |
| 8,617,991 B2 | 12/2013 | Lee et al. | |
| 8,637,350 B2 | 1/2014 | Ahn et al. | |
| 8,653,676 B2* | 2/2014 | Kim | H01L 24/19 257/787 |
| 8,912,048 B2* | 12/2014 | Kim | H01L 21/78 438/113 |
| 2007/0287265 A1* | 12/2007 | Hatano | H01L 21/6835 438/458 |
| 2008/0113508 A1 | 5/2008 | Akolkar et al. | |
| 2008/0128882 A1 | 6/2008 | Baek et al. | |
| 2011/0124198 A1 | 5/2011 | Lee et al. | |
| 2011/0151678 A1 | 6/2011 | Ashtiani et al. | |
| 2011/0159639 A1* | 6/2011 | Yee | H01L 21/568 438/109 |
| 2012/0009787 A1 | 1/2012 | Kim | |
| 2012/0049358 A1* | 3/2012 | Cheng | H01L 21/76898 257/738 |
| 2012/0086048 A1 | 4/2012 | Park et al. | |
| 2012/0171846 A1 | 7/2012 | Hwang | |
| 2012/0178235 A1 | 7/2012 | Pachamuthu et al. | |
| 2013/0113118 A1* | 5/2013 | Kim | H01L 23/49816 257/782 |

\* cited by examiner

METHOD OF FABRICATING A PACKAGED INTEGRATED CIRCUIT WITH THROUGH-SILICON VIA AN INNER SUBSTRATE

CROSS-REFERENCE TO RELATED APPLICATION

This application claims the benefit of Korean Patent Application No. 10-2014-0085364, filed on Jul. 8, 2014, in the Korean Intellectual Property Office, the disclosure of which is incorporated herein in its entirety by reference.

BACKGROUND

Inventive concepts relate to a semiconductor package, and more particularly, to a semiconductor package using a bonding layer as a permanent layer and a method of manufacturing the same.

Semiconductor packages may be completed by performing packing processes on semiconductor chips formed by performing various semiconductor processes on wafers. A semiconductor package in which one or more semiconductor chips are stacked by using a through silicon via (TSV) may be implemented, for example. There is a need for a technology for manufacturing semiconductor packages, which prevents physical defects or deterioration in electrical characteristics of the semiconductor packages, which may occur in a process of stacking semiconductor chips, and which maintains the reliability of the semiconductor packages.

SUMMARY

In exemplary embodiments in accordance with principles of inventive concepts a method of manufacturing a semiconductor package includes forming a bonding layer on a carrier substrate, bonding an inner substrate and the carrier substrate with the bonding layer, removing the carrier substrate, forming a gap-filling portion by removing a portion of the bonding layer to expose a portion of a solder ball provided in the inner substrate, and mounting the inner substrate on a package substrate by performing thermocompression bonding.

In exemplary embodiments in accordance with principles of inventive concepts a method of manufacturing a semiconductor package includes grinding an upper surface of the inner substrate to expose an upper surface of a through silicon via (TSV) provided in the inner substrate after bonding the inner and carrier substrates.

In exemplary embodiments in accordance with principles of inventive concepts a method of manufacturing a semiconductor package includes forming a first pad on the inner substrate to be connected with the TSV.

In exemplary embodiments in accordance with principles of inventive concepts a method of manufacturing a semiconductor package includes the grinding of the upper surface of the inner substrate by a chemical mechanical polishing (CMP) process.

In exemplary embodiments in accordance with principles of inventive concepts a method of manufacturing a semiconductor package includes the solder ball provided in the inner substrate is connected with a second pad formed on an upper surface of the package substrate.

In exemplary embodiments in accordance with principles of inventive concepts a method of manufacturing a semiconductor package includes the solder ball provided in the inner substrate is connected with a solder on pad (SOP) formed on the second pad.

In exemplary embodiments in accordance with principles of inventive concepts a method of manufacturing a semiconductor package includes the bonding layer is formed by a spin coating process.

In exemplary embodiments in accordance with principles of inventive concepts a method of manufacturing a semiconductor package includes the forming of the gap-filling portion is performed by a surface cutting process.

In exemplary embodiments in accordance with principles of inventive concepts a method of manufacturing a semiconductor package includes the bonding layer is a bonding film.

In exemplary embodiments in accordance with principles of inventive concepts a method of manufacturing a semiconductor package includes stacking at least one semiconductor chip on the inner substrate mounted on the package substrate.

In exemplary embodiments in accordance with principles of inventive concepts a method of manufacturing a semiconductor package includes forming a first bonding layer on a carrier substrate, bonding an inner substrate and the carrier substrate with the first bonding layer, removing the carrier substrate, forming a first gap-filling portion by removing a portion of the first bonding layer to expose a portion of a solder ball provided in the inner substrate, forming a second gap-filling portion covering at least a portion of a solder on pad (SOP) provided on an upper surface of a package substrate, and mounting the inner substrate on the package substrate by performing thermocompression bonding.

In exemplary embodiments in accordance with principles of inventive concepts a method of manufacturing a semiconductor package includes an inner substrate that is an interposer.

In exemplary embodiments in accordance with principles of inventive concepts a method of manufacturing a semiconductor package includes the inner substrate is a first semiconductor chip.

In exemplary embodiments in accordance with principles of inventive concepts a method of manufacturing a semiconductor package includes stacking a second semiconductor chip on the first semiconductor chip.

In exemplary embodiments in accordance with principles of inventive concepts a method of manufacturing a semiconductor package includes the stacking of the second semiconductor chip by forming a third gap-filling portion on a lower surface of the second semiconductor chip to expose a portion of a solder ball provided in the second semiconductor chip, and stacking the second semiconductor chip on the first semiconductor chip by performing thermocompression bonding.

In exemplary embodiments in accordance with principles of inventive concepts a method of manufacturing a semiconductor package includes forming a bonding layer on a carrier substrate, bonding an inner substrate including through silicon vias and solder balls to the carrier substrate with the bonding layer, removing the carrier substrate, removing a portion of the bonding layer to expose a portion of the solder balls, the remaining portion of the bonding layer forming a gap-filling layer between the solder balls, mounting the inner substrate to a package substrate to electrically connect a solder ball with a pad on a surface of the package substrate.

In exemplary embodiments in accordance with principles of inventive concepts a method of manufacturing a semiconductor package includes mounting a semiconductor chip on the inner substrate to make electrical contact between pads on the semiconductor chip and the through silicon vias of the inner substrate.

In exemplary embodiments in accordance with principles of inventive concepts a method of manufacturing a semiconductor package includes the surface of the bonding layer mated to the package substrate is substantially planar to conform to a substantially planar package substrate surface.

In exemplary embodiments in accordance with principles of inventive concepts a method of manufacturing a semiconductor package includes the surface of the bonding layer mated to the package substrate is stepped to conform to a stepped package substrate surface.

In exemplary embodiments in accordance with principles of inventive concepts a method of manufacturing a semiconductor package includes stacking a second semiconductor chip on the semiconductor chip and forming a molding portion to encapsulate the semiconductor chips and inner substrate.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
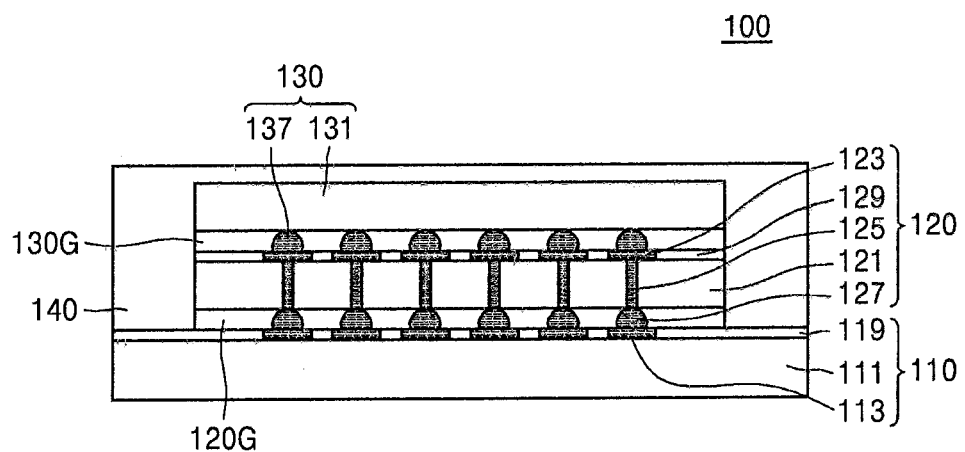
FIG. 1 is a cross-sectional view of an exemplary embodiment of a semiconductor package in accordance with principles of inventive concepts.

Various exemplary embodiments will be described more fully hereinafter with reference to the accompanying drawings, in which some exemplary embodiments are shown. Inventive concepts may, however, be embodied in many different forms and should not be construed as limited to the exemplary embodiments set forth herein. Rather, these exemplary embodiments are provided so that this description will be thorough and complete, and will convey the scope of inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items and the term "or" is meant to be inclusive, unless otherwise indicated.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts. The thickness of layers may be exaggerated for clarity.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of an exemplary embodiment of a semiconductor package 100 in accordance with principles of inventive concepts. Semiconductor package 100 includes a package substrate 110, an inner substrate 120 formed on an upper surface of the package substrate 110, a semiconductor chip 130 formed on an upper surface of the inner substrate 120, a gap-filling portion 120G formed between the package substrate 110 and the inner substrate 120, a gap-filling portions 130G formed between the inner substrate 120 and the semiconductor chip 130, and a molding portion 140.

In exemplary embodiments package substrate 110 is a substrate on which the inner substrate 120 and the semiconductor chip 130 are mounted. The package substrate 110 may be, for example, a printed circuit board (PCB). The PCB may be a single-sided PCB or a double-sided PCB, may be a multi-layer PCB including one or more inner wiring patterns inside thereof, and may be a rigid-PCB or a flexible-PCB, for example.

In exemplary embodiments in accordance with principles of inventive concepts, package substrate 110 includes a body layer 111, an upper pad 113, and an upper protecting layer 119. Although not illustrated, the package substrate 110 may further include: a lower pad (not shown) formed on a lower surface of the body layer 111 and electrically connected with a wiring pattern in the body layer 111, a lower protecting layer (not shown), and an external connecting member (not shown) formed on the lower pad and with which the semiconductor package 100 is mounted on an external system substrate or a main board.

A multi-layered or a single-layered wiring pattern (not shown) may be formed in the body layer 111. Upper pad 113 and the lower pad may be electrically connected with each other through the wiring pattern.

The upper pad 113 may be formed on an upper surface of the body layer 111 using a conductive material and may be electrically connected with a connecting member 127 of the inner substrate 120, for example. The upper pad 113 may be, for example, formed of Al or Cu, using a pulse plating or a direct current plating method.

The upper protecting layer 119 and the lower protecting layer may protect the body layer 111. The upper protecting layer 110 and the lower protecting layer may be, for example, formed of an oxide layer, a nitride layer, or oxide and nitride double layers. Additionally, the upper protecting layer 119 may be formed of an oxide layer or a nitride layer, for example, a silicon oxide layer or a silicon nitride layer, using an HDP-CVD process.

In exemplary embodiments in accordance with principles of inventive concepts inner substrate 120 includes a body portion 121, an upper pad 123, a through silicon via (TSV) 125, the connecting member 127, and an upper protecting layer 129. Although not illustrated, the inner substrate 120 may further include a lower protecting layer (not shown) formed on a lower surface of the body portion 121 and protecting the body portion 121 from the outside, and a lower pad (not shown) formed on the lower surface of the body portion 121 using a conductive material and electrically connecting the TSV 125 and the connecting member 127.

The inner substrate 120 may be formed of an active wafer or an interposer substrate. In exemplary embodiments in accordance with principles of inventive concepts, the active wafer refers to a wafer, such as a silicon wafer, in which a semiconductor chip may be formed.

When the inner substrate 120 is formed of an active wafer, the body portion 121 may include a semiconductor substrate (not shown), an integrated circuit layer (not shown), an interlayer insulating layer (not shown), and an inter-metal insulating layer (not shown). A multi-layered wiring layer (not shown) may be formed in the inter-metal insulating layer. In exemplary embodiments in accordance with principles of inventive concepts, the semiconductor substrate may include a group IV material wafer, such as a silicon wafer, or a group III-V compound wafer. Additionally, the semiconductor substrate may be formed as a single crystal wafer, such as a silicon single crystal wafer, for example, or various wafers, such as an epitaxial wafer, a polished wafer, an annealed wafer, and a silicon on insulator (SOI) wafer, may be used as the semiconductor substrate. In exemplary embodiments in accordance with principles of inventive concepts, the epitaxial wafer refers to a wafer in which a crystalline material is grown on a single crystal silicon substrate.

In exemplary embodiments in which the inner substrate 120 is formed of an active wafer, the inner substrate 120 may function as a memory device or a logic device. The memory device may include, for example, DRAM, SRAM, flash memory, EEPROM, PRAM, MRAM, and RRAM.

Even when the inner substrate 120 is formed of an active wafer, the body portion 121 may include only a semiconductor substrate with no integrated circuit layer, the interlayer insulating layer, and the inter-metal insulating layer.

When the inner substrate 120 is formed of an interposer substrate, the body portion 121 may be just like a supporting substrate and may be formed of silicon, glass, ceramic, or plastic, for example.

The upper pad 123 may be formed on an upper surface of the body portion 121 using a conductive material and may penetrate the upper protecting layer 129 to be electrically connected with the TSV 125. Although it is illustrated in FIG. 1 that the upper pad 123 is directly connected with the TSV 125, the upper pad 123 may be connected with the TSV 125 through a wiring layer (not shown) in the body portion 121, for example. The upper pad 123 may be, for example, formed of Al or Cu using a pulse plating or a direct current plating method.

In exemplary embodiments in accordance with principles of inventive concepts TSV 125 is electrically connected with the upper pad 123 and the connecting member 127 by penetrating the body portion 121.

The TSV 125 may include at least one metal. For example, the TSV 125 may include a barrier metal layer (not shown) or a wiring metal layer (not shown). The barrier metal layer may include a stack of one or more selected from Ti, Ta, TiN, and TaN. The wiring metal layer may include one or more selected from Al, Au, Be, Bi, Co, Cu, Hf, In, Mn, Mo, Ni, Pb, Pd, Pt, Rh, Re, Ru, Ta, Te, Ti, W, Zn, and Zr. For example, the wiring metal layer may include a stack of one or more selected from W, Al, and Cu. However, materials of the TSV 125 are not limited thereto.

In some exemplary embodiments, the TSV 125 may be formed as any one of a via-first structure, a via-middle structure, and a via-last structure. The via-first structure refers to a structure in which the TSV is formed before an integrated circuit layer is formed, the via-middle structure refers to a structure in which the TSV is formed before a multi-layered wiring layer is formed after the integrated circuit layer is formed, and the via-last structure refers to a structure in which the TSV is formed after the multi-layered wiring layer is formed.

A spacer insulating layer (not shown) may be interposed between the TSV 125 and the body portion 121. The spacer insulating layer may prevent circuit devices in the body portion 121 and the TSV 125 from directly contacting each other.

The connecting member 127 may electrically connect the TSV 125 of the inner substrate 120 and the upper pad 113 of the package substrate 110. The connecting member 127 may be formed of a conductive material, such as Cu, Al, Ag, Tin, Au, and solder. However, materials of the connecting member 127 are not limited thereto.

The semiconductor chip 130 may include a body portion 131 and a connecting member 137, similar to the inner substrate 120.

According to the present exemplary embodiment, only one semiconductor chip 130 is stacked on the inner substrate 120. However, in other exemplary embodiments a plurality of semiconductor chips may be stacked on the inner substrate 120. That is, the semiconductor chip 130 according to the present exemplary embodiment does not include a TSV and an upper pad, unlike the inner substrate 120. However, in other embodiments the semiconductor chip 130 may include the TSV and the upper pad, and also, an additional semiconductor chip may be stacked on the semiconductor chip 130.

Although not illustrated, the semiconductor chip 130 may further include a lower protecting layer (not shown) formed on a lower surface of the body portion 131 and protecting the body portion 131 from the outside, and a lower pad (not shown) formed on the lower surface of the body portion 131 using a conductive material and electrically connecting a wiring layer (not shown) in the body portion 131 and the connecting member 137.

The body portion 131 and the connecting member 137 have similar structures and functions to those of the body portion 121 and the connecting member 127 of the inner substrate 120, and thus, their detailed descriptions will not be repeated here.

In exemplary embodiments in accordance with principles of inventive concepts semiconductor chip 130 may be a memory device or a logic device. As described above, the memory device may include DRAM, SRAM, flash memory, EEPROM, PRAM, MRAM, and RRAM.

Both the inner substrate 120 and the semiconductor chip 130 may be memory devices or both the inner substrate 120 and the semiconductor chip 130 may be logic devices. Alternatively, one of the inner substrate 120 and the semiconductor chip 130 may be a memory device, and the other may be a logic device. For example, the inner substrate 120 may be a logic device and the semiconductor chip 130 may be a memory device.

The gap-filling portion 120G may fill a space between the package substrate 110 and the inner substrate 120 to strengthen adhesion between the package substrate 110 and the inner substrate 120. Similar to the gap-filling portion 120G, the gap-filling portion 130G may fill a space between the inner substrate 120 and the semiconductor chip 130 to strengthen adhesion between the inner substrate 120 and the semiconductor chip 130.

At least one of the gap-filling portions 120G and 130G in the present exemplary embodiment may be formed from a bonding layer 120Gx (refer to FIG. 5A) used to bond a carrier substrate 1000 (refer to FIG. 5A) and an inner substrate 120x (refer to FIG. 5A), as will be described later by referring to FIGS. 5A through 5H.

One of the gap-filling portions 120G and 130G, which is not formed from the bonding layer 120Gx, may be, for example, formed of molding resin.

Hereinafter, for convenience of explanation, descriptions will be made by focusing on an example in which the gap-filling portion 1200 is formed from the bonding layer 120Gx (refer to FIG. 5A) and the gap-filling portion 130G is formed of molding resin.

Figure 5A:
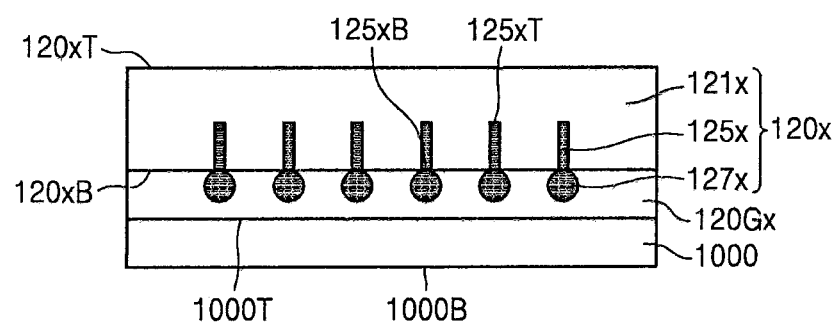
FIGS. 5A through 5G are cross-sectional views for describing an order of processes for manufacturing an exemplary embodiment of a semiconductor package, in accordance with principles of inventive concepts.

According to the present exemplary embodiment, the gap-filling portion 1200 is formed from the bonding layer 120Gx (refer to FIG. 5A). The gap-filling portion 120G may be, for example, formed of a non-conductive film (NCF), an anisotropic conductive film (ACF), a UV film, an instantaneous adhesive, a thermosetting adhesive, a laser hardening adhesive, an ultrasonic hardening adhesive, or a non-conductive paste (NCP). Exemplary methods of forming the gap-filling portion 120G will be described in greater detail in the discussion associated with FIGS. 5A through 5H.

The gap-filling portion 130G according to the present exemplary embodiment is formed of molding resin. In some exemplary embodiments, after the semiconductor chip 130 is bonded to the inner substrate 120, the gap-filling portion 130G may be formed through an additional process; by underfilling a space between the semiconductor chip 130 and the inner substrate 120 with the molding resin, before the molding portion 140 is formed, for example. In this case, the gap-filling portion 130G may be formed of the same molding resin as the molding portion 140 which will be described later. However, inventive concepts are not limited thereto and the gap-filling portion 130G may also be formed of molding resin, which is different from that of the molding portion 140.

In other exemplary embodiments, the gap-filling portion 130G may be formed by using a molded underfill (MUF) process. In such exemplary embodiments, the MUF process refers to a process according to which the process of underfilling the space between the semiconductor chip 130 and the inner substrate 120 is not additionally performed, and the space between the semiconductor chip 130 and the inner substrate 120 is filled simultaneously in the process of forming the molding portion 140. If the gap-filling portion 130G is formed by the MUF process, the gap-filling portion 130G may be formed of the same molding resin as the molding portion 140.

The molding portion 140 may enclose the inner substrate 120 and the semiconductor chip 130 on the package substrate 110 to protect the inner substrate 120 and the semiconductor chip 130. The molding portion 140 may be, for example, formed of a silicon-based material, a thermosetting material, a thermo-plastic material, or a UV-treated material.

Figure 2:
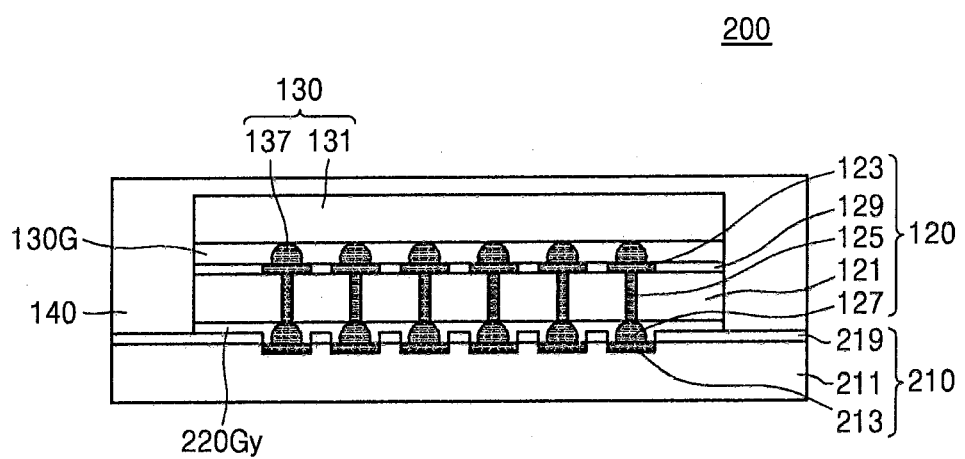
FIG. 2 is a cross-sectional view of an exemplary embodiment of a semiconductor package in accordance with principles of inventive concepts.

FIG. 2 is a cross-sectional view of a semiconductor package 200 according to another exemplary embodiment of the inventive concept. In FIG. 2, like reference numerals refer to like elements in FIG. 1. For brevity of explanation, their detailed descriptions will not be repeated here.

Referring to FIG. 2, the semiconductor package 200 includes a package substrate 210, the inner substrate 120 formed on an upper surface of the package substrate 210, the semiconductor chip 130 formed on the upper surface of the inner substrate 120, a gap-filling portion 220Gy formed between the package substrate 210 and the inner substrate 120, a gap-filling portions 130G formed between the inner substrate 120 and the semiconductor chip 130, and the molding portion 140.

Body layer 211, upper pad 213, and upper protecting layer 219 in the present exemplary embodiment may have similar structures and functions as those of the body layer 111, the upper pad 113, and the upper protecting layer 119 described with reference to FIG. 1. However, the upper protecting layer 219 in the present exemplary embodiment is formed at a higher level than the upper pad 213. That is, the upper pad 213 according to the present exemplary embodiment has a structure in which at least a portion of the upper pad 213 is buried in the body layer 211. In this exemplary embodiment in accordance with principles of inventive concepts, the upper protecting layer 219 may be patterned by an etching process to expose the upper pad 213. Because the upper surface of the package substrate 210 has step portions, a lower surface of the gap-filling portion 220Gy may also have step portions according to the upper surface of the package substrate 210.

Unlike in FIGS. 1 and 2, the upper pad 213 may be formed at a higher level than the upper protecting layer 219. In such embodiments the lower surface of a gap-filling portion may also have step portions according to an upper surface of a package substrate.

Figure 3:
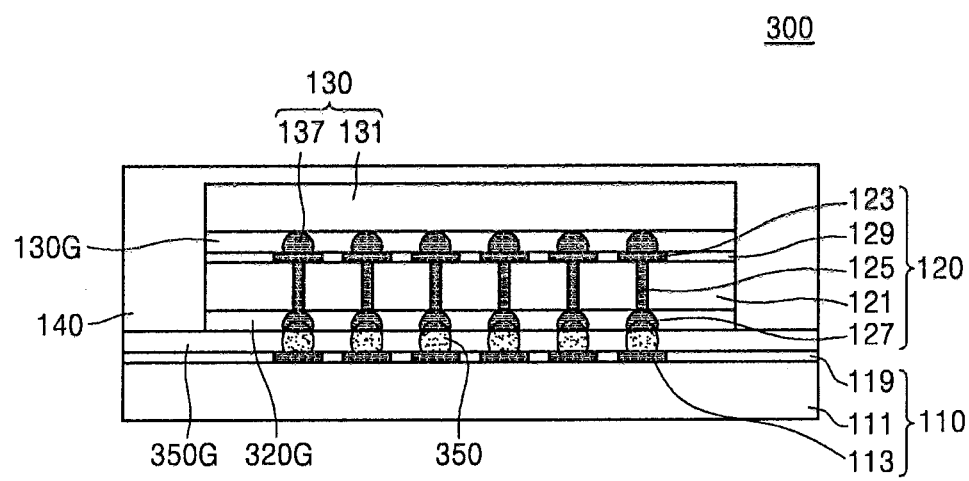
FIG. 3 is a cross-sectional view of an exemplary embodiment of a semiconductor package in accordance with principles of inventive concepts.

FIG. 3 is a cross-sectional view of a semiconductor package 300 according to another exemplary embodiment in accordance with principles of inventive concepts. In FIG. 3, like reference numerals refer to like elements in FIGS. 1 and 2. For brevity of explanation, detailed descriptions of like elements will not be repeated here.

Referring to FIG. 3, the semiconductor package 300 includes the package substrate 110, the inner substrate 120 formed on the upper surface of the package substrate 110, the semiconductor chip 130 formed on the upper surface of the inner substrate 120, the gap-filling portion 130G interposed between the semiconductor chip 130 and the inner substrate 120, an upper gap-filling portion 320G and a lower gap-filling portion 350G interposed between the inner substrate 120 and the package substrate 110, a solder on pad (SOP) 350 formed by penetrating the lower gap-filling portion 350G, and the molding portion 140.

The semiconductor package 300 according to the present exemplary embodiment may have a similar structure to that of the semiconductor package 100 described with reference to FIG. 1, except that the SOP 350 and the lower gap-filling portion 350G are formed between the inner substrate 120 and the package substrate 110.

The SOP 350 may be formed on the upper pad 113 of the package substrate 110 by using a conductive material and may electrically connect the connecting member 127 of the inner substrate 120 and the upper pad 113 of the package substrate 110. The SOP 350 may be, for example, a Cu pad coated with Tin.

The upper gap-filling portion 320G and the lower gap-filling portion 350G may be formed of a non-conductive adhesive film or an adhesive agent, such as an NCF, an ACF, a UV film, an instantaneous adhesive, a thermosetting adhesive, a laser hardening adhesive, an ultrasonic hardening adhesive, and an NCP, similar to the gap-filling portion 120G described with reference to FIG. 1. The upper gap-filling portion 320G and the lower gap-filling portion 350G may be formed of adhesive materials different from each other. However, inventive concepts are not limited thereto, and the upper gap-filling portion 320G and the lower gap-filling portion 350G may be formed of the same adhesive material.

Although FIG. 3 illustrates the connecting member 127 and the SOP 350 as separate components, reflow soldering may be performed on the connecting member 127 and the SOP 350 in a process of mounting the inner substrate 120 on the package substrate 110 so that the connecting member 127 and the SOP 350 are formed as one component. The method of mounting the inner substrate 120 on the package substrate 110 using the upper gap-filling portion 320G and the lower gap-filling portion 350G will be described in detail later in the discussion related to FIGS. 8A through 8D.

As shown in the present exemplary embodiment, because the inner substrate 120 is bonded to the package substrate 110 using the SOP 350 and the lower gap-filling portion 350G, the inner substrate 120 may be stably mounted on the package substrate 110.

Figure 4:
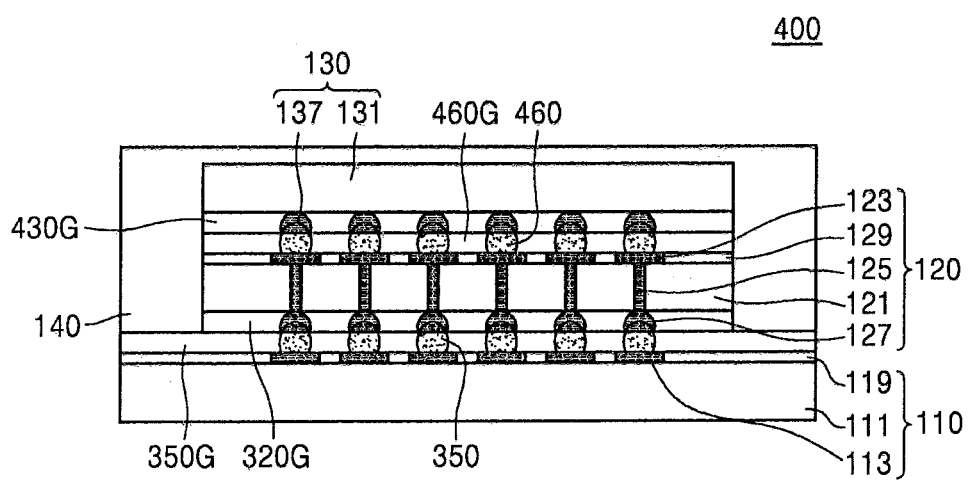
FIG. 4 is a cross-sectional view of an exemplary embodiment of a semiconductor package in accordance with principles of inventive concepts.

FIG. 4 is a cross-sectional view of a semiconductor package 400 according to another exemplary embodiment in accordance with principles of inventive concepts. In FIG. 4, like reference numerals refer to like elements in FIGS. 1 through 3. For brevity of explanation, detailed descriptions of like elements will not be repeated here.

Referring to FIG. 4, the semiconductor package 400 includes the package substrate 110, the inner substrate 120 formed on the upper surface of the package substrate 110, the semiconductor chip 130 formed on the upper surface of the inner substrate 120, an upper gap-filling portion 430G and a lower gap-filling portion 460G interposed between the semiconductor chip 130 and the inner substrate 120, the upper gap-filling portion 320G and the lower gap-filling portion 350G interposed between the inner substrate 120 and the package substrate 110, SOPs 350 and 460 formed respectively by penetrating the lower gap-filling portions 350G and 460G, and the molding portion 140.

The semiconductor package 400 in the present exemplary embodiment may have a similar structure to that of the semiconductor package 300 described in the discussion related to FIG. 3, except that the SOP 460 and the lower gap-filling portion 460G are formed between the inner substrate 120 and the semiconductor chip 130.

The SOP 460 is formed on the upper pad 123 of the inner substrate 120 using a conductive material and may electrically connect the connecting member 137 of the semiconductor chip 130 and the upper pad 123 of the inner substrate 120. The SOP 460 may be, for example, a Cu pad coated with Tin.

The upper gap-filling portion 430G and the lower gap-filling portion 460G may be formed of a non-conductive adhesive film or an adhesive agent, such as an NCF, an ACF, a UV film, an instantaneous adhesive, a thermosetting adhesive, a laser hardening adhesive, an ultrasonic hardening adhesive, and an NCP, similar to the upper gap-filling portion 320G and the lower gap-filling portion 350G described with reference to FIG. 3. The upper gap-filling portion 430G and the lower gap-filling portion 460G may be formed of adhesive materials different from each other. However, they are not limited thereto, and the upper gap-filling portion 430G and the lower gap-filling portion 460G may be formed of the same adhesive material.

Although FIG. 4 illustrates the connecting member 137 and the SOP 460 as separate components, reflow soldering may be performed on the connecting member 137 and the SOP 460 in a process of mounting the semiconductor chip 130 on the inner substrate 120 so that the connecting member 137 and the SOP 460 are formed as one component. An exemplary method of mounting the semiconductor chip 130 on the inner substrate 120 using the SOP 460 and the lower gap-filling portion 460G will be described in greater detail in the discussion related to FIGS. 9A through 9C.

FIGS. 5A through 5G are cross-sectional views for describing an order of processes for an exemplary embodiment of manufacturing the semiconductor package 100 in accordance with principles of inventive concepts. In FIGS. 5A through 5G, like reference numerals refer to like elements in FIGS. 1 through 4. For brevity of explanation, detailed descriptions of the elements will not be repeated here.

Referring to FIG. 5A, a carrier substrate 1000 having an upper surface 1000T and a lower surface 1000B, and an inner substrate 120x having an upper surface 120xT and a lower surface 120xB are prepared. In some exemplary embodiments, the upper surface 120xT of the inner substrate 120x may be a non-active surface of a semiconductor chip and the lower surface 120xB of the inner substrate 120x may be an active surface of the semiconductor chip.

Figure 5B:
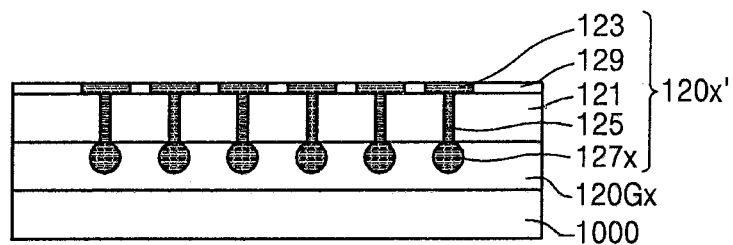
Figure 5C:
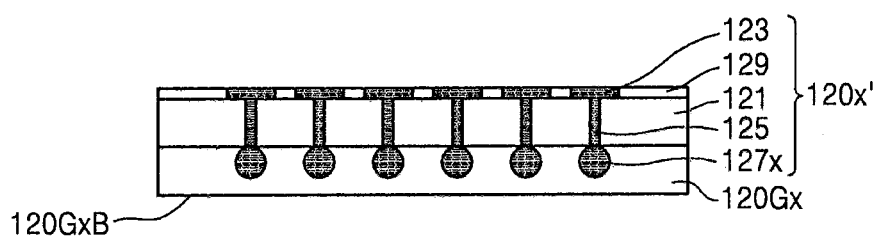
Figure 5D:
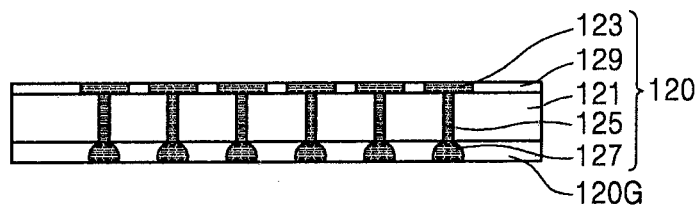

The inner surface 120x in the present exemplary embodiment refers to the inner substrate 120 before performing sequential processes which are to be described in the discussion related to FIGS. 5B through 5D. Similarly, a body portion 121x, a TSV 125x, and a connecting member 127x respectively refer to the body portion 121, the TSV 125, and the connecting member 127 before performing the sequential processes which are to be described in the discussion related to FIGS. 5B through 5D.

The inner substrate 120x includes the TSV 125x, and the connecting member 127x electrically connected with the TSV 125x or with an integrated circuit (not shown) formed in the inner substrate 120x. Also, although not illustrated, the inner substrate 120x may further include a conductive pad (not shown) electrically connecting the TSV 125x and the connecting member 127x.

As illustrated in the exemplary embodiment of FIG. 5A, an upper surface 125xT of the TSV 125x may be buried in the body portion 121x, and a lower surface 125xB of the TSV 125x may be exposed at the lower surface 120xB of the inner substrate 120x and be connected with the connecting member 127x. However, structures of the TSV 125x are not limited thereto, and the TSV 125x may be formed to penetrate the inner substrate 120x. That is, the TSV 125x may have a structure in which the upper surface 125xT and the lower surface 125xB are respectively exposed at the upper surface 120xT and the lower surface 120xB of the inner substrate 120x.

The carrier substrate 1000 may be formed as a silicon substrate, a germanium substrate, a silicon-germanium substrate, a gallium-arsenic (GaAs) substrate, a glass substrate, a plastic substrate, or a ceramic substrate, for example. The carrier substrate 1000 may support the inner substrate 120x while the sequential processes, which are to be described in greater detail in the discussion related to FIG. 5B, are performed.

After the carrier substrate 1000 and the inner substrate 120x are prepared, the bonding layer 120Gx is formed on the upper surface 1000T of the carrier substrate 1000. The bonding layer 120Gx may be formed of an NCF, an ACF, an instantaneous adhesive, a thermosetting adhesive, a laser hardening adhesive, an ultrasonic hardening adhesive, or an NCP. The bonding layer 120Gx may be, for example, formed using a spin coating, a painting, or a spraying method, for example.

When the carrier substrate 1000 is separated from the bonding layer 120Gx by laser ablation in the sequential process (refer to FIG. 5C), a laser reactant may be included in the bonding layer 120Gx or an additional laser reactive layer (not shown) may be formed between the bonding layer 120Gx and the carrier substrate 1000. This aspect will be described in greater detail in the discussion related to FIG. 5C.

After the bonding layer 120Gx is formed on the upper surface 1000T of the carrier substrate 1000, the inner substrate 120x is bonded to the carrier substrate 1000 by the bonding layer 120Gx as a medium. In some exemplary embodiments, after the carrier substrate 1000 and the inner substrate 120x are bonded, an annealing process may be performed for adhesion between the carrier substrate 1000 and the inner substrate 120x. For example, the annealing process may be performed in the sequential processes which are to be described in greater detail in the discussion related to FIGS. 5B through 5D, for solidly supporting the inner substrate 120x.

The bonding layer 120Gx in the present exemplary embodiment may support the inner substrate 120x while the sequential process to be described with reference to FIG. 5B is performed, and may function as the gap-filling portion 120G after the inner substrate 120 is mounted (refer to FIG. 5F) on the package substrate 110.

Referring to FIG. 5B, a backside process is performed in the state in which the inner substrate 120x is bonded to the carrier substrate 1000. That is, an upper surface of the body portion 121x is ground on the upper surface 120xT of the inner substrate 120x to complete the body portion 121 and the TSV 125 and the upper pad 123 and the upper protection layer 129 are formed.

In the present exemplary embodiment, an inner substrate 120x' refers to the inner substrate 120x with respect to which the backside process is completed.

Although in the present exemplary embodiment, the grinding process and the forming of the upper pad 123 and the upper protecting layer 129 are illustrated as examples of the backside process, the backside process is not limited thereto; the backside process may include various unit processes to form the inner substrate 120x.

In some exemplary embodiments, the grinding process may be performed to the same level as the upper surface 125xT of the TSV 125x (refer to FIG. 5A) or a lower level than the upper surface 125xT of the TSV 125x (refer to FIG. 5A), until the TSV 125x is exposed to the outside. In other exemplary embodiments, the grinding process may be performed to a higher level than the upper surface 125xT of the TSV 125x, and then, the TSV 125x may be exposed to the outside by an etching process. The TSV 125 refers to the TSV 125x with respect to which the grinding process is completed.

The grinding process may be performed, for example, by a chemical mechanical polishing (CMP) process.

After the grinding process is performed, the upper pad 123 and the upper protecting layer 129 are formed on the body portion 121. The upper pad 123 may electrically connect the connecting member 137 of the semiconductor chip 130 which is stacked by the sequential process, and the TSV 125 of the inner substrate 120. The upper protecting layer 129 may protect the body portion 121 and insulate between upper pads 123 formed separate from one another. The upper protecting layer 129 may be formed, for example, of an oxide layer or a nitride layer.

Referring to FIGS. 5C and 5D, the carrier substrate 1000 is separated from the inner substrate 120x' and the gap-filling portion 120G is formed.

The process of separating the carrier substrate 1000 may be performed by a physical method using a blade (not shown), a chemical method using a separating solvent, or laser ablation using a laser, for example.

After the process of separating the carrier substrate 1000, the bonding layer 120Gx remains bonded with the inner substrate 120x'.

In exemplary embodiments in which the carrier substrate 1000 is separated from the inner substrate 120x' by laser ablation, a portion of the bonding layer 120Gx may be removed in reaction with a laser or an adhesive force may be decreased, thereby separating the carrier substrate 1000 from the inner substrate 120x'. In exemplary embodiments in accordance with principles of inventive concepts, when an additional laser reactive layer (not shown) is formed between the bonding layer 120Gx and the carrier substrate 1000, the carrier substrate 1000 may be separated from the inner substrate 120x' by removing the laser reactive layer by laser ablation.

After the carrier substrate 1000 is separated from the inner substrate 120x', a process such as surface cutting is performed on a lower surface of the bonding layer 120Gx to form the gap-filling portion 120G, which exposes a portion of the connecting member 127 through a surface of the remaining bonding layer 1200x, which is gap-filling portion 120G.

Figure 5E:
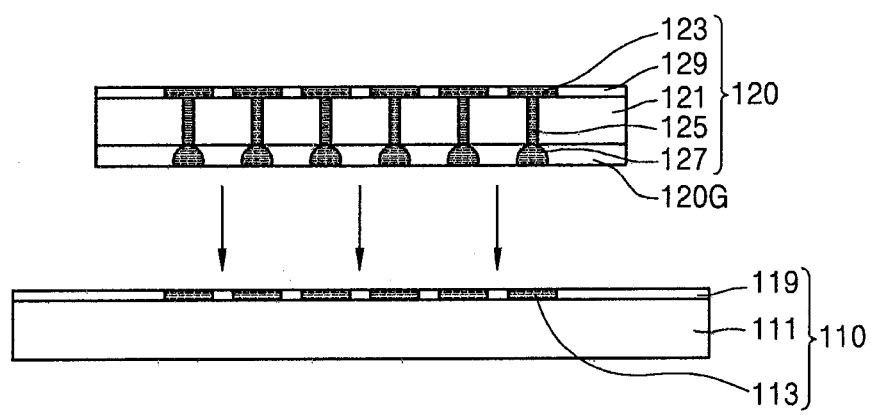
Figure 5F:
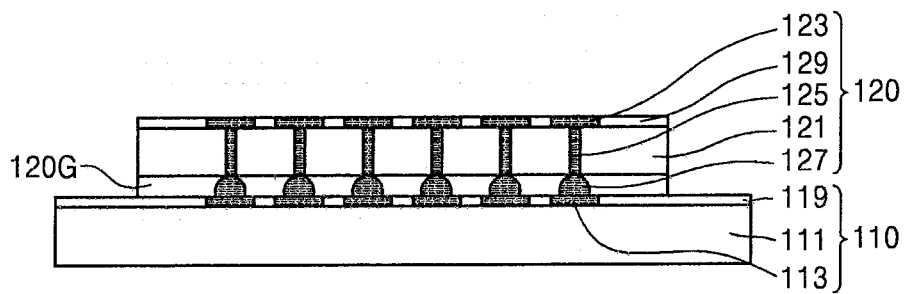

Referring to FIGS. 5E and 5F, the inner substrate 120 is mounted on the package substrate 110 by a medium of the gap-filling portion 120G with respect to which the surface cutting is completed, by performing thermocompression bonding. That is, the connecting member 127 of the inner substrate 120 is connected with the upper pad 113 of the package substrate 110.

In some exemplary embodiments, reflow soldering may be performed on the connecting member 127 of the inner substrate 120 during the thermocompression bonding so that the connecting member 127 is physically combined with the upper pad 113 of the package substrate 110 as one component.

The gap-filling portion 120G is interposed between the inner substrate 120 and the package substrate 110 and may prevent contact defects between the connecting member 127 of the inner substrate 120 and the upper pad 113 of the package substrate 110, which could otherwise occur due to the deformation of the inner substrate 120 or the package substrate 110.

According to the present exemplary embodiment, the bonding layer 120Gx, which is used for bonding the inner substrate 120x with the carrier substrate 1000 for the backside process, is processed to be used as the gap-filling portion 120G, as described with reference to FIGS. 5A through 5F. By doing so, the reliability of the semiconductor package 100 (refer to FIG. 1) may be secured and production costs thereof may be reduced.

That is, in exemplary embodiments in accordance with principles of inventive concepts, after the backside process, the bonding layer 120Gx is not removed and is, instead, used as the gap-filling portion 120G. By leaving the bonding layer 120Gx substantially intact, damage to the connecting member 127 that may otherwise occur during removal of the bonding layer 1200x is avoided, as is warpage of the inner substrate 120. Additionally the cost associated with removing the bonding layer 120Gx and sequential processes after the removal, such as cleaning, may also be avoided.

Figure 5G:
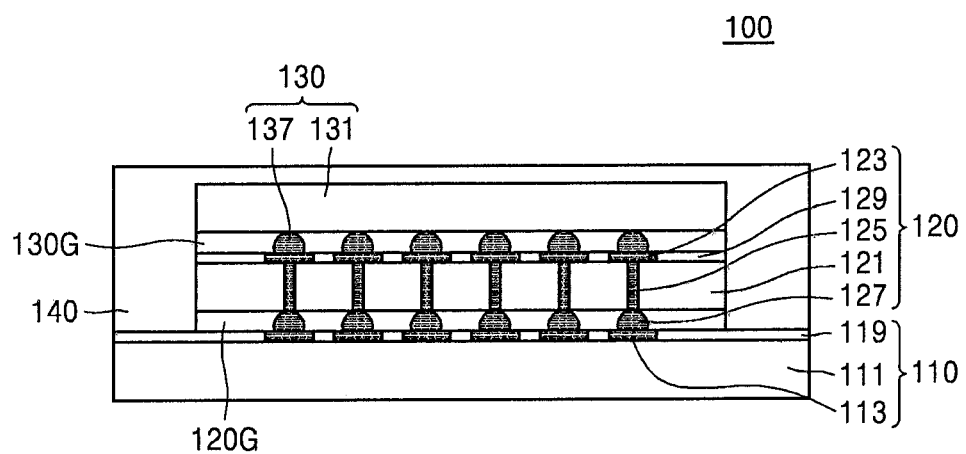

Referring to FIG. 5G, the semiconductor chip 130 is stacked on the inner substrate 120 and the molding portion 140 is formed.

In the present exemplary embodiment, only one semiconductor chip 130 is stacked on the inner substrate 120. However, the structure of the inner substrate 120 is not limited thereto. In exemplary embodiments in accordance with principles of inventive concepts the inner substrate 120 may have a structure in which a plurality of semiconductor chips (not shown) are stacked on the inner substrate 120. Additionally, although in this exemplary embodiment the semiconductor chip 130 is formed in the same size as the inner substrate 120, the semiconductor chip 130 may be formed in a different size from the inner substrate 120 in accordance with principles of inventive concepts.

The gap-filling portion 1300 is formed between the semiconductor chip 130 and the inner substrate 120. In some exemplary embodiments, the gap-filling portion 130G may be formed of substantially the same material as the gap-filling portion 120G described with reference to FIGS. 5A through 5D by substantially the same method as the gap-filling portion 120G. That is, the gap-filling portion 130G may be formed from a bonding layer (not shown) used to bond a carrier substrate (not shown) to the semiconductor chip 130 for the backside process of the semiconductor chip 130.

In other exemplary embodiments, the gap-filling portion 130G may be formed by underfilling a space between the semiconductor chip 130 and the inner substrate 120 with molding resin through an additional process, before forming the molding portion 140, or may be formed by an MUF process during the process of forming the molding portion 140. This aspect was described in the discussion related to FIG. 1, and thus, it will not be repeated here.

After the semiconductor chip 130 is stacked, the molding portion 140 is formed to complete the manufacture of the semiconductor package 100. The molding portion 140 is formed to enclose the inner substrate 120 and the semiconductor chip 130 on the package substrate 110.

The molding portion 140 may be formed by injecting molding resin of an appropriate amount onto the package substrate 110 by using an injection element (for example, a nozzle), and then by using a pressurization element (not shown) such as a press, for example. In exemplary embodiments, the process conditions, such as a delay time between the molding resin injection and the pressurization, the amount of molding resin injected, a pressurization temperature, and pressure, may be configured by considering a physical property of the molding resin, such as a viscosity of the molding resin, for example.

In some exemplary embodiments, the molding resin may be epoxy-group molding resin or polyimide-group molding resin. The epoxy-group molding resin may be, for example, polycyclic aromatic epoxy resin, bisphenol-group epoxy resin, naphthalene-group epoxy resin, o-cresol novolac epoxy resin, dicyclopentadiene epoxy resin, biphenyl-group epoxy resin, or epoxy phenol novolac resin. In other exemplary embodiments, the molding resin may further include carbon black, which is a coloring agent. The molding resin may further include a hardening agent, a hardening accelerator, a filling member, or a flame retardant, in addition to the carbon black used as the coloring agent.

FIGS. 6A through 6F are cross-sectional views for describing an exemplary order of processes for manufacturing a semiconductor package in accordance with principles of inventive concepts, such as the semiconductor package 100. In FIGS. 6A through 6F, like reference numerals refer to like elements in FIGS. 1 through 5G. For brevity of explanation, the descriptions of such elements will not be repeated here.

Figure 6A:
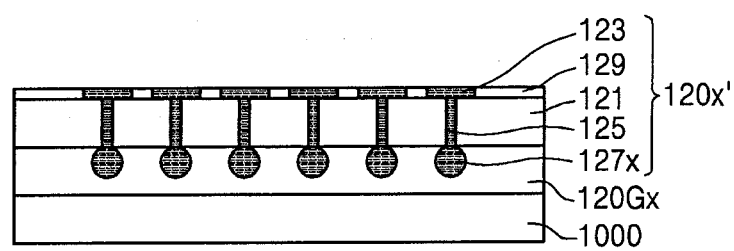
FIGS. 6A through 6F are cross-sectional views for describing an order of processes for manufacturing an exemplary embodiment of a semiconductor package, in accordance with principles of inventive concepts.

Referring to FIG. 6A, the inner substrate 120x' is bonded to the carrier substrate 1000 by the bonding layer 120Gx as a medium. As described with reference to FIGS. 5A and 5B, the inner substrate 120x' refers to the inner substrate 120x with respect to which the grinding process and the process of forming the upper pad 123 are completed.

The process of bonding the carrier substrate 1000 and the inner substrate 120x (refer to FIG. 5A), the process of grinding the inner substrate 120x, and the process of forming the upper pad 123 may be performed in a manner similar to the processes described in the discussion related to FIGS. 5A and 5B.

Figure 6B:
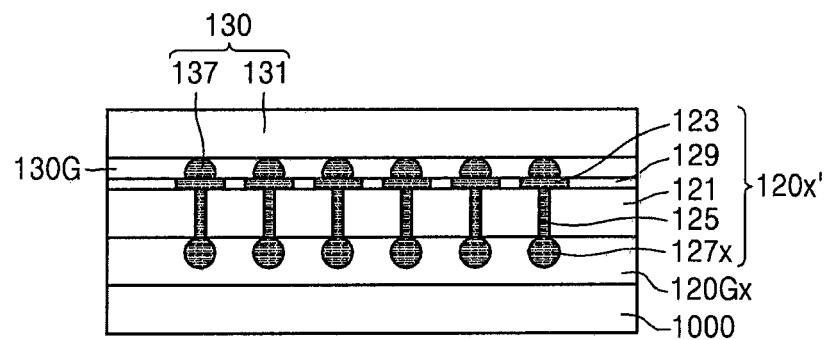
Figure 6C:
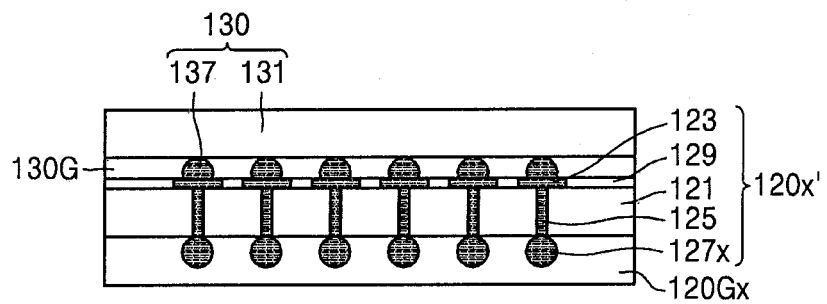
Figure 6D:
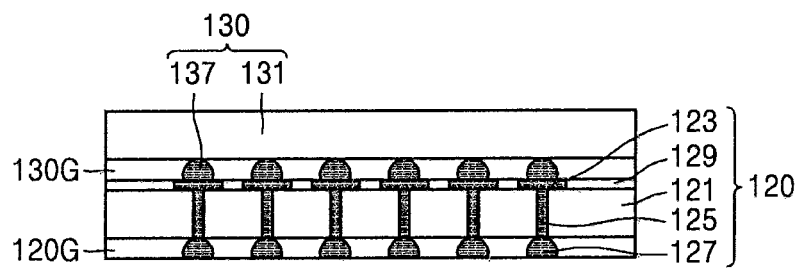

Referring to FIGS. 6B through 6D, the semiconductor chip 130 is stacked on the inner substrate 120x' before the carrier substrate 1000 is separated from the inner substrate 120x'. Then, the carrier substrate 1000 is separated from the inner substrate 120x' and surface cutting is performed with respect to the lower surface of the bonding layer 120Gx to form the gap-filling portion 120G.

Figure 6E:
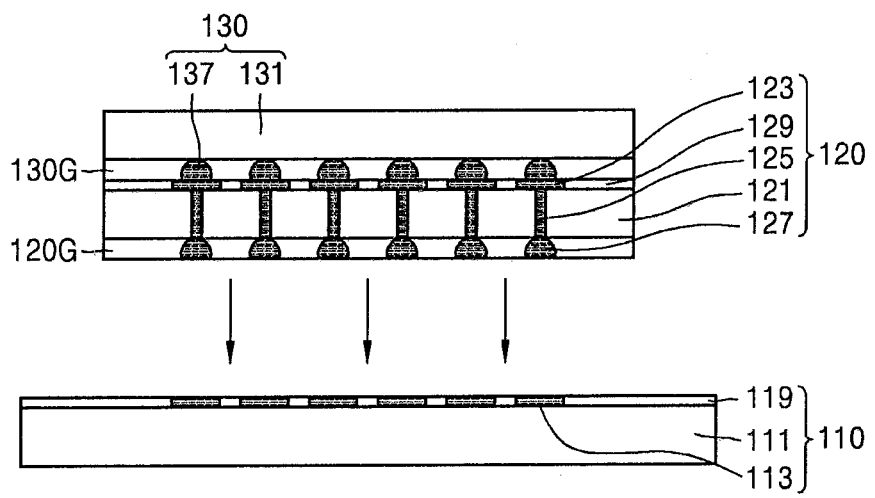
Figure 6F:
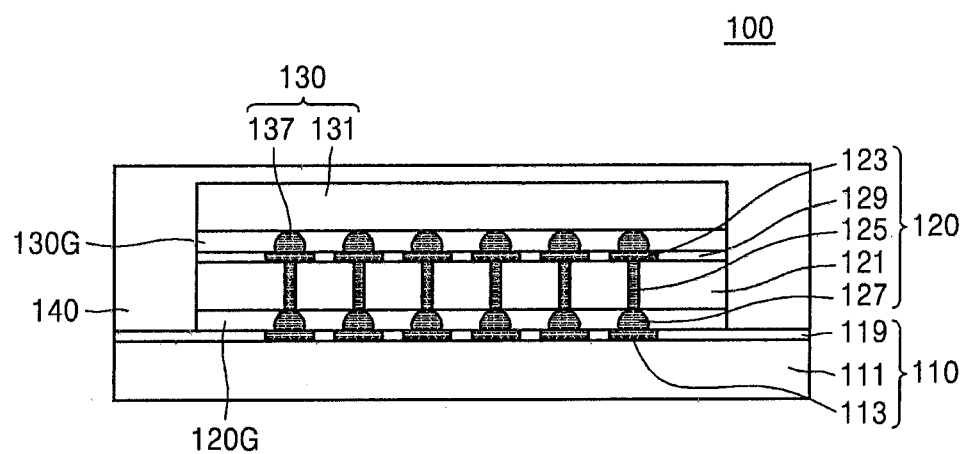

Referring to FIGS. 6E and 6F, the inner substrate 120 and the semiconductor chip 130, which are stacked, are mounted on the package substrate 110. Then, the molding portion 140 is formed to enclose the inner substrate 120 and the semiconductor chip 130 on the package substrate 110 to complete the manufacture of the semiconductor package 100.

Figure 7A:
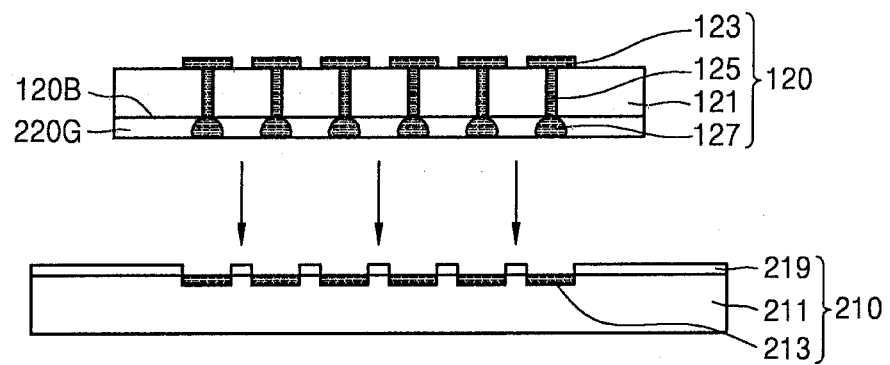
FIGS. 7A through 7C are cross-sectional views for describing an order of processes for manufacturing an exemplary embodiment of a semiconductor package, in accordance with principles of inventive concepts.
Figure 7B:
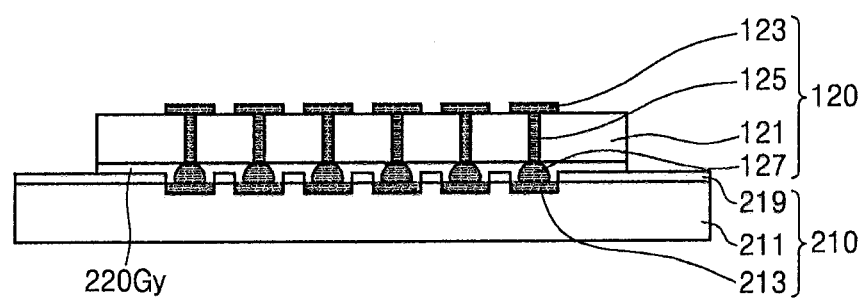
Figure 7C:
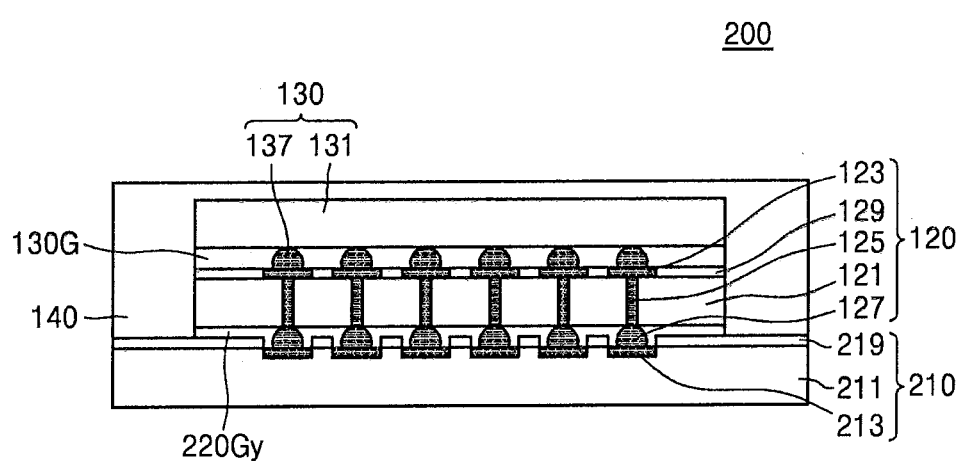

FIGS. 7A through 7C are cross-sectional views for describing an exemplary order of processes for manufacturing a semiconductor package in accordance with principles of inventive concepts, such as the semiconductor package 20Q. In FIGS. 7A through 7C, like reference numerals refer to like elements in FIGS. 1 through 6F. For brevity of explanation, a detailed description of those elements will not be repeated here.

Referring to FIG. 7A, the inner substrate 120 and a package substrate 210 are prepared.

A gap-filling portion 220G with respect to which the surface cutting process is completed is formed on a lower surface 120B of the inner substrate 120. The gap-filling portion 220G may be formed by a process similar to that by which the gap-filling portion 120G described in the discussion related to FIGS. 5A through 5D is formed.

The package substrate 210 is a substrate on which the inner substrate 120 is mounted and is similar to the package substrate 110 described in the discussion related to FIGS. 1 through 6F. That is, the body layer 211, the upper pad 213, and the upper protecting layer 219 respectively have similar structures and functions to those of the body layer 111, the upper pad 113, and the upper protecting layer 119 described with reference to FIGS. 1 through 6F.

However, in the present exemplary embodiment, the upper pad 213 of the package substrate 210 has a structure in which the upper pad 213 is buried in the body layer 211, unlike the example of the package substrate 110. That is, the upper protecting layer 219 is formed at a higher level than the upper pad 213.

Referring to FIG. 7B, the inner substrate 120 is mounted on the package substrate 210 by the gap-filling portion 220Gy as medium, by performing thermocompression bonding. That is, the connecting member 127 of the inner substrate 120 is connected with the upper pad 213 of the package substrate 210.

In the present exemplary embodiment, the upper protecting layer 219 of the package substrate 210 is formed at a higher level than the upper pad 213. Accordingly, a lower surface of the gap-filling portion 220Gy may vary to have step portions according to an upper surface of the package substrate 210. Connecting members 127 of the inner substrate 120 are formed separate from one another according to the upper protecting layer 219 of the package substrate 210.

Referring to FIG. 7C, the semiconductor chip 130 is mounted on the inner substrate 120 and the molding portion 140 is formed to complete the manufacture of the semiconductor package 200.

According to the present exemplary embodiment, because the connecting members 127 are formed separate from one another according to the upper protecting layer 219 of the package substrate 210, the reflow soldering that may be performed on the connecting members 127 during the thermocompression bonding, thus causing contact defects, may be prevented.

FIGS. 8A through 8D are cross-sectional views for describing an exemplary order of processes for manufacturing a semiconductor package in accordance with principles of inventive concepts, such as the semiconductor package 300. In FIGS. 8A through 8D, like reference numerals refer to like elements in FIGS. 1 through 7C. For brevity of explanation, detailed descriptions of repeated elements will not be repeated here.

Figure 8A:
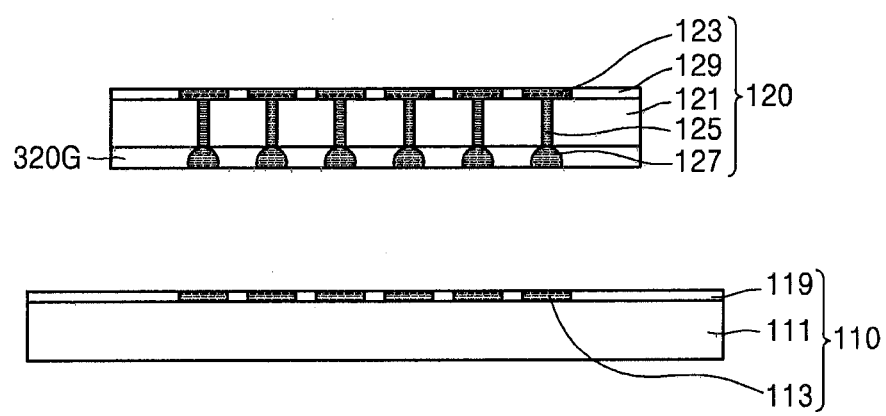
FIGS. 8A through 8D are cross-sectional views for describing an order of processes for manufacturing an exemplary embodiment of a semiconductor package, in accordance with principles of inventive concepts.

Referring to FIG. 8A, the inner substrate 120 and the package substrate 110 are prepared.

The upper gap-filling portion 320G with respect to which the surface cutting process is completed is formed on the lower surface 120B of the inner substrate 120. The upper gap-filling portion 320G may be formed by a process similar to that by which the gap-filling portion 120G described in the discussion related to FIGS. 5A through 5D is formed.

Figure 8B:
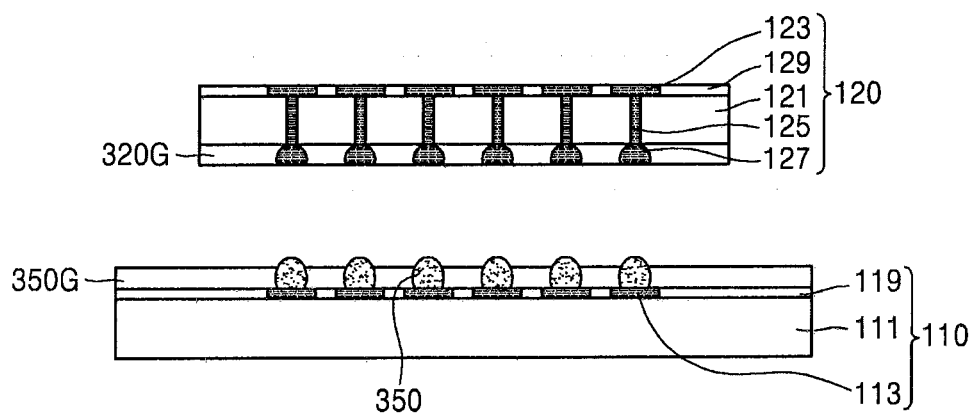
Figure 8C:
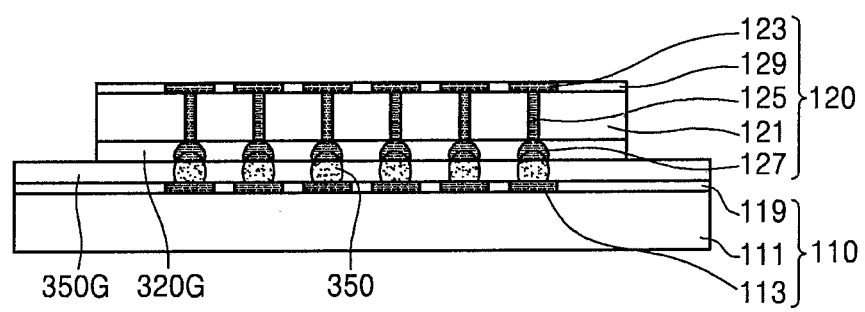

Referring to FIGS. 8B and 8C, the SOP 350 and the lower gap-filling portion 350G are formed on the package substrate 110, and the inner substrate 120 is mounted on the package substrate 110 by a medium of the upper gap-filling portion 320G and the lower gap-filling portion 350G.

Materials of the SOP 350 and the lower gap-filling portions 350G, methods of forming the SOP 350 and the lower gap-filling portion 350G, and methods of mounting the inner substrate 120 on the package substrate 110 by the SOP 350 and the lower gap-filling portion 350G as a medium, may vary according to the materials of the lower gap-filling portion 350G. In the present exemplary embodiment, an example using a thermal compression non-conductive paste (TCNCP) to which pressure is applied at a predetermined temperature using an NCP, will be described.

The SOP 350 may be, for example, a Cu pad coated with Tin. The SOP 350 may be formed by coating the upper pad 113 of the package substrate 110 sequentially with Cu and Tin, through a photolithography or a plating process, and then by performing reflow soldering.

The lower gap-filling portion 350G may be formed by spreading the NCP, which is a material for under-filling the surface of the package substrate 110.

After the SOP 350 and the lower gap-filling portion 350G are formed on the package substrate 110, vacuum absorption is performed on the inner substrate 120 using a bonding tool (not shown) to transport the inner substrate 120 above the package substrate 110. Then, as the bonding tool is lowered, the SOP 350 contacts the connecting member 127 of the inner substrate 110. The bonding tool pressurizes the inner substrate 120 by a predetermined force in a state in which heat and pressure are applied, to fuse the connecting member 127 of the inner substrate 120 and the SOP 350 on the package substrate 110.

In some exemplary embodiments, reflow soldering may be performed on the connecting member 127 of the inner substrate 120 during the thermocompression bonding so that the connecting member 127 is physically combined with the SOP 350 on the package substrate 110 as one component.

Through the above-described process, the inner substrate 120 and the package substrate 110 are electrically connected with each other by the connecting member 127 and the SOP 350 as a medium, and SOPs 350 are insulated from one another by the lower gap-filling portion 350G.

Figure 8D:
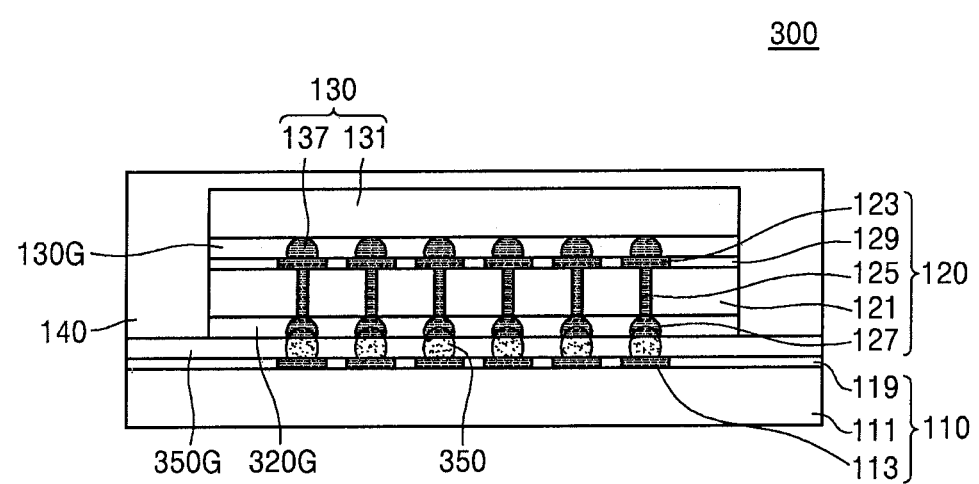

Referring to FIG. 8D, the semiconductor chip 130 is mounted on the inner substrate 120, and the molding portion 140 is formed to complete the manufacture of the semiconductor package 300.

As in the present exemplary embodiment, when the bonding layer (not shown) used in the backside process (refer to FIG. 5B) is processed to be used as the upper gap-filling portion 320G, and the inner substrate 120 is mounted on the package substrate 110 by using the SOP 350 and the lower gap-filling portion 350G, the problem of incomplete removal of the bonding layer is avoided. Additionally, adhesion between the inner substrate 120 and the package substrate 110 may be strengthened and, as a result, the reliability of the semiconductor package 300 may be increased.

Figure 9A:
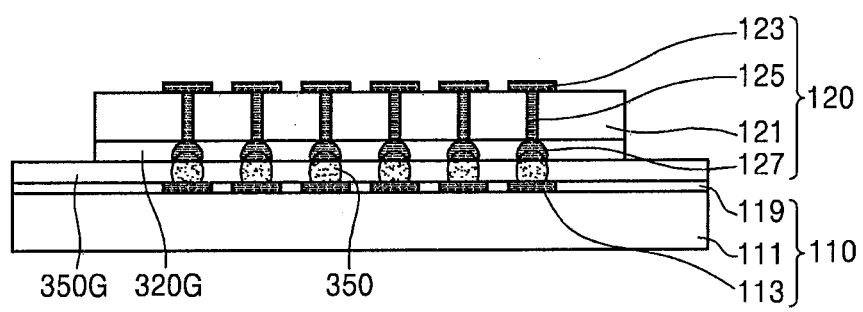
FIGS. 9A through 9C are cross-sectional views for describing an order of processes for manufacturing an exemplary embodiment of a semiconductor package, in accordance with principles of inventive concepts.
Figure 9B:
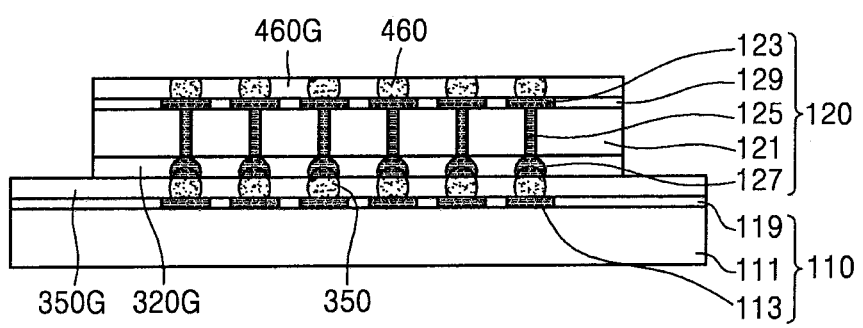
Figure 9C:
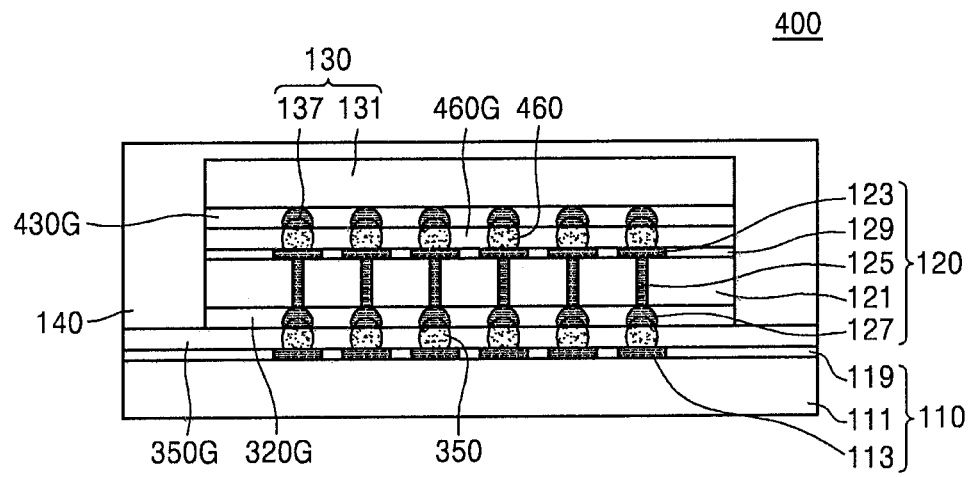

FIGS. 9A through 9C are cross-sectional views for describing an exemplary order of processes for manufacturing a semiconductor package in accordance with principles of inventive concepts, such as the semiconductor package 400. In FIGS. 9A through 9C, like reference numerals refer to like elements in FIGS. 1 through 8D. For brevity of explanation, detailed descriptions of repeated elements will not be repeated here.

Although the semiconductor package 400 (refer to FIG. 9D) has a structure similar to that of the semiconductor package 300 described with reference to FIGS. 8A thorough 8D, in the semiconductor package 400, the semiconductor chip 130 is mounted on the inner substrate 120 by the upper gap-filling portion 430G and the lower gap-filling portion 460G as a medium.

Referring to FIG. 9A, in this exemplary embodiment the inner substrate 120 is mounted on the package substrate 110 by the upper gap-filling portion 320G and the lower gap-filling portion 350G as a medium, as described with reference to FIGS. 8A through 8C. However, the mounting of the inner substrate 120 is not limited thereto. In this exemplary embodiment the inner substrate 120 may be mounted on the package substrate 110 by the gap-filling portions 120G and 220Gy as a medium, without the lower gap-filling portion 350G and the SOP 350, as described with reference to FIGS. 5A through 7C.

Referring to FIG. 9B, the SOP 460 and the lower gap-filling portion 460G are formed on the inner substrate 120.

The SOP 460 may electrically connect the connecting member 137 of the semiconductor chip 130 (refer to FIG. 9C) mounted by a sequential process and the upper pad 123 of the inner substrate 120, and the lower gap-filling portion 460G may strengthen adhesion between the inner substrate 120 and the semiconductor chip 130. The SOP 460 may be a Cu pad coated with Tin, similar to the SOP 350 described with reference to FIG. 8B. The SOP 460 may be formed by performing photolithograpy, plating, or a reflow soldering process, for example. The lower gap-filling portion 460G may be formed by performing a process similar to that by which the lower gap-filling portion 350G described with reference to FIGS. 8A through 8D is formed.

Referring to FIG. 9C, the upper gap-filling portion 430G with respect to which the surface cutting process is completed is formed on the lower surface of the semiconductor chip 130. The upper gap-filling portion 430G may be formed by a process similar to that by which the gap-filling portion 120G described in the discussion related to FIGS. 5A through 5D is formed.

The semiconductor chip 130 is mounted on the inner substrate 120 by the upper gap-filling portion 430G and the lower gap-filling portion 460G as a medium.

After the semiconductor chip 130 is mounted on the inner substrate 120, the molding portion 140 enclosing the inner substrate 120 and the semiconductor chip 130 on the package substrate 110 is formed to complete the manufacture of the semiconductor package 400.

As illustrated in the present exemplary embodiment, when the bonding layer (not shown) used in the backside process (refer to FIG. 5B) is processed to be used as the upper gap-filling portion 430G, and the semiconductor chip 130 is mounted on the inner substrate 120 by using the SOP 460 and the lower gap-filling portion 460G, incomplete removal of the bonding layer may be avoided. Additionally, adhesion between the semiconductor chip 130 and the inner substrate 120 may be strengthened, thereby improving the reliability of the semiconductor package 400.

Figure 10:
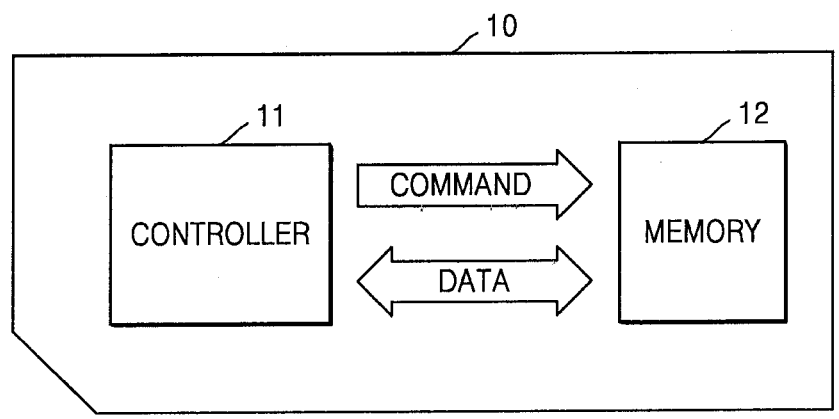
FIG. 10 is a block diagram an exemplary embodiment of a memory card including a semiconductor package in accordance with principles of inventive concepts.

FIG. 10 is a block diagram of a memory card including a semiconductor package in accordance with principles of inventive concepts.

Referring to FIG. 10, a controller 11 and a memory 12 may be arranged in the memory card 10 and may exchange electrical signals. For example, when the controller 11 provides a command, the memory 12 may transfer data. The controller 11 and/or the memory 12 may include any semiconductor package in accordance with principles of inventive concepts, such semiconductor packages 100, 200, 300, or 400, for example. The memory 12 may include a memory array (not shown) or a memory array bank (not shown).

The memory card 10 may be used in memory devices, such as a memory stick card, a smart media card (SM), secure digital (SD), a mini secure digital card (mini SD), or a multimedia card (MMC), for example.

Figure 11:
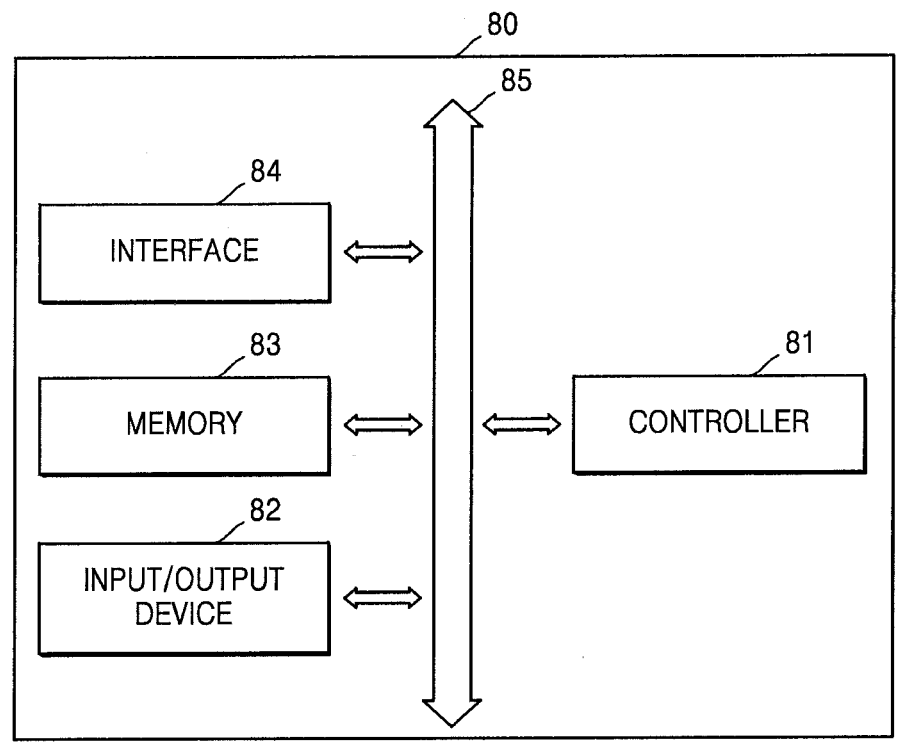
FIG. 11 is a block diagram of an exemplary embodiment of an electronic system including a semiconductor package in accordance with principles of inventive concepts.

FIG. 11 is a block diagram of an electronic system 80 including a semiconductor package in accordance with principles of inventive concepts.

Referring to FIG. 11, the electronic system 80 may include a controller 81, an input/output device 82, a memory 83, and an interface 84. The electronic system 80 may be a mobile system or a system transferring and receiving information. The mobile system may be a personal digital assistant (PDA), a portable computer, a web tablet, a wireless phone, a mobile phone, a digital music player, or a memory card, for example.

The controller 81 may execute a program and control the electronic system 80. The controller 81 may be a microprocessor, a digital signal processor, a microcontroller, or a similar device. The input/output device 82 may be used for inputting or outputting data of the electronic system 80.

The electronic system 80 may be connected with an external device, for example, a personal computer or a network, using the input/output device 82, to exchange data with the external device. The input/output device 82 may be, for example, a keypad, a keyboard, or a display. The memory 83 may store code and/or data for an operation of the controller 81, and/or may store data processed in the controller 81. The controller 81 and the memory 83 may include any one of the semiconductor packages 100, 200, 300, and 400 according to the exemplary embodiments of the inventive concept. The interface 84 may be a data transfer path between the electronic system 80 and other external devices. The controller 81, the input/output device 82, the memory 83, and the interface 84 may communicate with one another via a bus 85.

For example, the electronic system 80 may be used in mobile phones, MP3 players, navigations, portable multimedia players (PMP), solid state disks (SSD), or household appliances.

Figure 12:
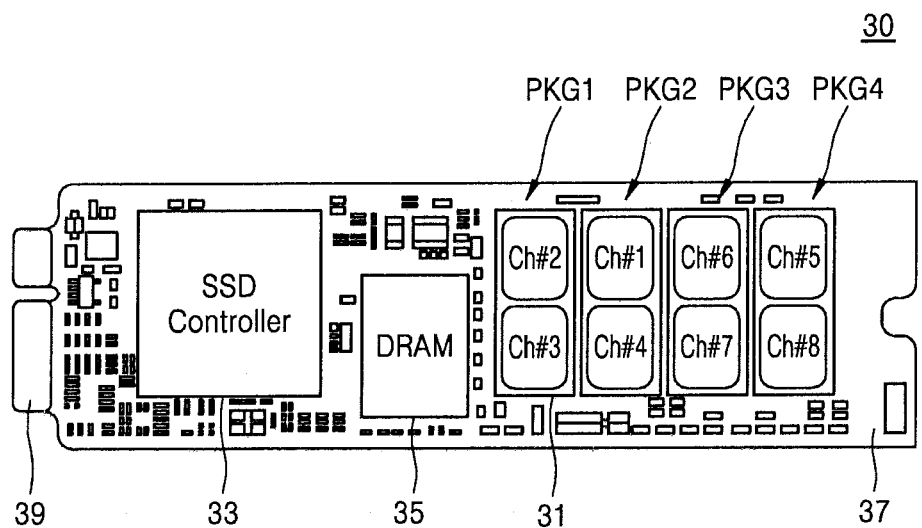
FIG. 12 is a cross-sectional view of an exemplary embodiment of an SSD device applying semiconductor packages in accordance with principles of inventive concepts and FIG. 12 illustrates an example in which an electronic system of FIG. 11 is applied to the SSD device.

FIG. 12 is a cross-sectional view of an SSD device 30 which includes a semiconductor package in accordance with principles of inventive concepts. FIG. 12 illustrates an exemplary embodiment in which the electronic system 80 of FIG. 11 is applied to the SSD device 30.

Referring to FIG. 12, the SSD 30 according to the present exemplary embodiment may include a memory package 31, an SSD controller 33, dynamic random access memory (DRAM) 35, and a main board 37.

The memory package 31, the SSD controller 33, and the DRAM 35 may include a semiconductor package in accordance with principles of inventive concepts, such as any one of the semiconductor packages 100, 200, 300, and 400. However, it is not limited thereto, and the SSD device 30 may include semiconductor packages of other structures, which implement an inner sealing member and an outer sealing member having different moduli.

The memory package 31 may be mounted on the main board 37 via an external connecting member and may include four memory packages PKG1, PKG2, PKG3, and PKG4 as illustrated in FIG. 12. However, it is not limited thereto, and more memory packages 31 may be mounted according to a channel supply state of the SSD controller 33. When the memory package 31 is formed as multi-channels, the number of memory packages 31 may be reduced to less than 4.

The memory package 31 may be mounted on the main board 37 via the external connecting member 2400 such as a solder ball, using a ball grid array (BGA) method. However, embodiments are not limited thereto, and the memory package 31 may be mounted using other mounting methods. For example, the memory package 31 may be mounted by a pin grid array (PGA) method, a tape carrier package (TCP) method, a chip-on-board (COB) method, a quad flat non-leaded (QFN) method, or a quad flat package (QFP) method.

In exemplary embodiments SSD controller 33 may include eight channels, and the eight channels may be connected one-to-one with corresponding channels of the four memory packages PKG1, PKG2, PKG3, and PKG4, to control semiconductor chips in the memory package 31.

The SSD controller 33 may include a program which may transfer and receive signals to and from external devices by a serial advanced technology attachment (SATA) standard, a parallel advanced technology attachment (PATA) standard, or a small computer system interface (SCSI) standard. Here, the SATA standard may include all SATA standards, such as SATA-1, SATA-2, SATA-3, and e-SATA (external SATA). The PATA standard may include all integrated drive electronics (IDE) standards, such as IDE and enhanced IDE (E-IDE).

Additionally, the SSD controller 33 may perform an EEC or FTL process. The SSD controller 33 may be mounted on the main board 37 as a package shape. The SSD controller 33 may be mounted on the main board 37 using the BGA method, the PGA method, the TCP method, the COB method, the QFN method, or the QFP method, like the memory package 31.

The DRAM 35 is an auxiliary memory device and may serve as a buffer when exchanging data between the SSD controller 33 and the memory package 31. The DRAM 35 may also be mounted on the main board 37 by using a BGA method, a PGA method, a TCP method, a COB method, a QFN method, or a QFP method.

The main board 37 may be a printed circuit board, a flexible printed circuit board, a glass substrate, a ceramic substrate, or a tape substrate. The main board 37 may include, for example, a core board (not shown) having an upper surface and a lower surface, and resin layers (not shown) formed respectively on the upper surface and the lower surface of the core board. Also, the resin layers may be formed as multi-layered structures. Additionally, a signal layer, a ground layer, or a power-supply layer forming a wiring pattern may be interposed between the multi-layered structures. An additional wiring pattern may be formed on the resin layer. Minute patterns indicated on the main board 37 in FIG. 12 may refer to wiring patterns or a plurality of hand-operated devices. An interface 39 for communication with an external device may be formed on a side, for example, a left side, of the main board 37.

Figure 13:
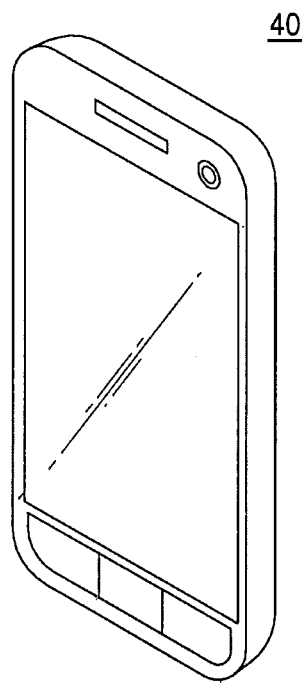
FIG. 13 is a cross-sectional view of an exemplary embodiment of an electronic device applying semiconductor packages in accordance with principles of inventive concepts.

FIG. 13 is a cross-sectional view of an electronic device which includes a semiconductor package in accordance with principles of inventive concepts.

FIG. 13 illustrates an example in which the electronic system 80 of FIG. 12 is applied to a mobile phone 40. In addition, the electronic system 80 may be applied to portable notebooks, MP3 players, navigations, solid state disks (SSD), vehicles, or household appliances, for example.

While exemplary embodiments in accordance with principles of inventive concepts have been particularly shown and described, it will be understood that various changes in form and details may be made herein without departing from the spirit and scope of inventive concepts.

What is claimed is:

1. A method of manufacturing a semiconductor package, the method comprising:
    forming a bonding layer on a carrier substrate;
    bonding an inner substrate and the carrier substrate with the bonding layer;
    removing the carrier substrate;
    exposing a portion of a solder ball provided in the inner substrate by removing a portion of the bonding layer; and
    mounting the inner substrate on a package substrate by employing the remaining portion of the bonding layer to perform thermocompression bonding, wherein the remaining portion of the bonding layer also provides a gap filling portion between the inner substrate and the package substrate.

2. The method of claim 1, further comprising, grinding an upper surface of the inner substrate to expose an upper surface of a through silicon via (TSV) provided in the inner substrate after bonding the inner and carrier substrates.

3. The method of claim 2, further comprising forming a first pad on the inner substrate to be connected with the TSV.

4. The method of claim 2, wherein the grinding of the upper surface of the inner substrate is performed by a chemical mechanical polishing (CMP) process.

5. The method of claim 1, wherein the solder ball provided in the inner substrate is connected with a second pad formed on an upper surface of the package substrate.

6. The method of claim 5, wherein the solder ball provided in the inner substrate is connected with a solder on pad (SOP) formed on the second pad.

7. The method of claim 1, wherein the bonding layer is formed by a spin coating process.

8. The method of claim 1, wherein the forming of the gap-filling portion is performed by a surface cutting process.

9. The method of claim 1, wherein the bonding layer is a bonding film.

10. The method of claim 1, further comprising stacking at least one semiconductor chip on the inner substrate mounted on the package substrate.

11. A method of manufacturing a semiconductor package, the method comprising:
forming a first bonding layer on a carrier substrate;
bonding an inner substrate and the carrier substrate with the first bonding layer;
removing the carrier substrate;
forming a first gap-filling portion by removing a portion of the first bonding layer to expose a portion of a solder ball provided in the inner substrate;
forming a second gap-filling portion covering at least a portion of a solder on pad (SOP) provided on an upper surface of a package substrate; and
mounting the inner substrate on the package substrate by performing thermocompression bonding.

12. The method of claim 11, wherein the inner substrate is an interposer.

13. The method of claim 11, wherein the inner substrate is a first semiconductor chip.

14. The method of claim 13, further comprising stacking a second semiconductor chip on the first semiconductor chip.

15. The method of claim 14, wherein the stacking of the second semiconductor chip comprises:
forming a third gap-filling portion on a lower surface of the second semiconductor chip to expose a portion of a solder ball provided in the second semiconductor chip; and
stacking the second semiconductor chip on the first semiconductor chip by performing thermocompression bonding.

16. A method of forming a semiconductor package, comprising:
forming a bonding layer on a carrier substrate;
bonding an inner substrate including through silicon vias and solder balls to the carrier substrate with the bonding layer;
removing the carrier substrate;
removing a portion of the bonding layer to expose a portion of the solder balls, the remaining portion of the bonding layer forming a gap-filling layer between the solder balls;
mounting the inner substrate to a package substrate using the remaining bonding layer to perform thermocompression bonding and to electrically connect a solder ball with a pad on a surface of the package substrate.

17. The method of claim 16 further comprising the step of mounting a semiconductor chip on the inner substrate to make electrical contact between pads on the semiconductor chip and the through silicon vias of the inner substrate.

18. The method of claim 17 further comprising stacking a second semiconductor chip on the semiconductor chip and forming a molding portion to encapsulate the semiconductor chips and inner substrate.

19. The method of claim 16 wherein the surface of the bonding layer mated to the package substrate is substantially planar, to conform to a substantially planar package substrate surface.

20. The method of claim 16 wherein the surface of the bonding layer mated to the package substrate is stepped, to conform to a stepped package substrate surface.

* * * * *